(12) United States Patent
Taki et al.

(10) Patent No.: US 6,300,155 B1
(45) Date of Patent: Oct. 9, 2001

(54) METHOD FOR PRODUCING SEMICONDUCTOR DEVICE BY COATING

(75) Inventors: Takafumi Taki, Nagoya; Ryoichi Handa, Nishio, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/538,491

(22) Filed: Mar. 30, 2000

(30) Foreign Application Priority Data

Mar. 30, 1999 (JP) .................................................. 11-89789

(51) Int. Cl.$^7$ .................................................. H01L 21/00
(52) U.S. Cl. .............................. 438/52; 438/424; 438/51; 438/53; 438/54; 438/55; 438/106; 257/666; 257/676; 257/678
(58) Field of Search .............................. 438/424, 51, 52, 438/53, 54, 55, 106, 116, 124, 127; 257/666, 787, 790, 678, 676, 793, 417, 418

(56) References Cited

U.S. PATENT DOCUMENTS

| | | | |
|---|---|---|---|
| 4,821,148 | * | 4/1989 | Kobayashi et al. ..................... 428/76 |
| 5,948,991 | | 9/1999 | Nomura et al. . |
| 6,025,640 | * | 2/2000 | Yagi et al. ............................. 257/666 |
| 6,034,421 | * | 3/2000 | Tokunaga ............................... 257/666 |
| 6,117,513 | * | 9/2000 | Hotta et al. ............................ 428/67 |
| 6,162,657 | * | 12/2000 | Schiele et al. ......................... 438/52 |

FOREIGN PATENT DOCUMENTS

| | | | |
|---|---|---|---|
| 63081964-A | * | 4/1988 | (JP) ........................................ 29/827 |
| 02298077-A | * | 12/1990 | (JP) ........................................ 438/53 |

OTHER PUBLICATIONS

U.S. application No. 08/982,034, Tokunaga, filed Dec. 1, 1997.
U.S. application No. 09/417,301, Watanabe et al., filed Oct. 13, 1999.

* cited by examiner

Primary Examiner—Matthew Smith
Assistant Examiner—V. Yevsikov
(74) Attorney, Agent, or Firm—Law Office of David G. Posz

(57) ABSTRACT

An electronic part is disposed in a space defined by upper and lower frames joined together. The upper frame has an opening portion, and a hollow packing member is disposed in the opening portion to expose a specific region of the electronic part. The upper and lower frames are further covered with a cover having a window portion at a position corresponding to the hollow portion of the packing member. In this state, a thin film is formed through the hollow portion to coat the specific region of the electronic part. The thin film is not adhered to the upper and lower frames. Accordingly, the upper and lower frames can be reused to form the thin film onto another electronic part successively.

22 Claims, 8 Drawing Sheets

FIG. IA
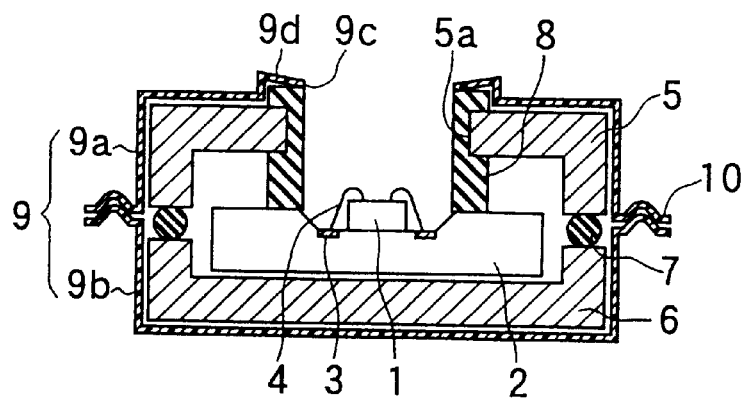
FIG. IB
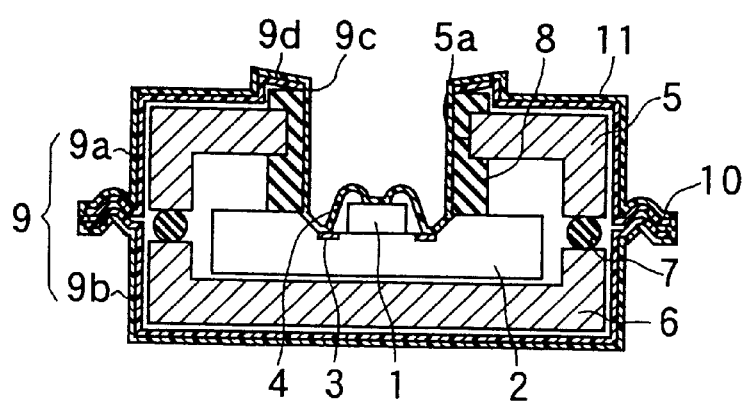
FIG. IC
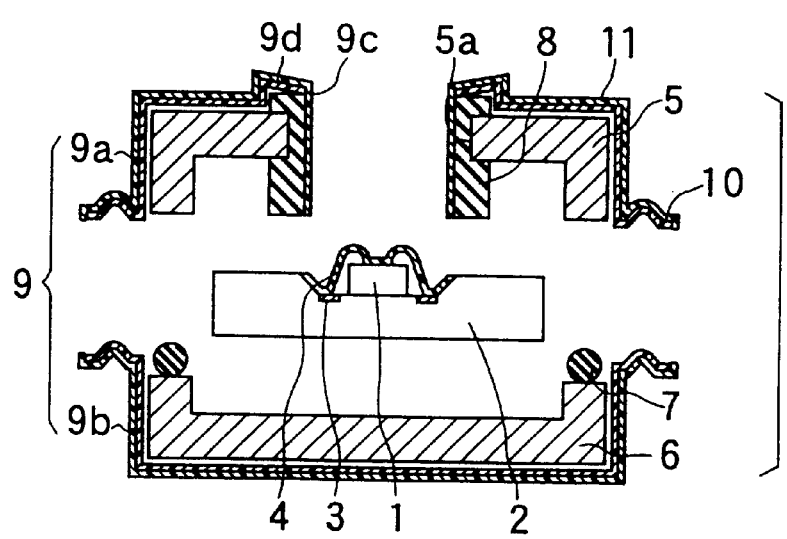

US 6,300,155 B1

METHOD FOR PRODUCING SEMICONDUCTOR DEVICE BY COATING

CROSS REFERENCE TO RELATED APPLICATION

This application is based upon and claims the benefit of Japanese Patent Application No. 11-89789 filed on Mar. 30, 1999, the contents of which are incorporated herein by reference.

BACKGROUND OF THE INVENTION

1. Field of the Invention

This invention relates to a method for producing a semiconductor device including semiconductor chips such as a pressure sensor by coating electrodes and wires with a thin film.

2. Description of the Related Art

A semiconductor chip such as a pressure sensor is mounted on an electronic part and is electrically connected to electrodes of the electronic part via wires. The wires and the electrodes are usually coated with a thin film not to be exposed, thereby preventing corrosion of the wires and the electrodes.

The thin film is deposited on the electronic part to coat the electrodes and the wires in a state in that only the semiconductor chip and a vicinal region around the chip is exposed from an opening portion of a mask member (frame) disposed on the electronic part. This is because the thin film must be prevented from being deposited on the other region of the electronic part than the exposed region, which has members to be electrically connected to external units.

Specifically, as shown in FIG. 11, in a pressure sensor assembly (semiconductor device), after a pressure sensor element 101 is installed in a resin-made housing 102, a wire 104 is bonded to a lead portion 103 insert-molded in the housing 102. Then, an organic deposition film is formed to coat the wire 104 and the lead portion 103 as indicated by a dotted line in FIG. 11. At that time, it is necessary to prevent the thin film from being deposited on the other region than the region where the sensor element 101 is mounted, because the other region (for instance, connector portion 102a) must provide electrical connection with external units.

SUMMARY OF THE INVENTION

In the method in which the other region of the electronic part is covered with the mask member, the thin film deposited on the mask member needs to be removed from the mask member so that the mask member can be reused. This is because, when the same mask member is reused to perform the above thin film coating step many times to many electronic parts, the thin film is deposited on the mask member every time and may be separated from the mask member during one thin film coating step accordingly. The separated thin film can be attached to the exposed region of the electronic part as contaminant, resulting in deterioration of semiconductor device characteristics (for instance, lessened sensitivity of the pressure sensor). The removal of the thin film from the mask member is, however, difficult, because the thin film is closely adhered to the mask member.

The present invention has been made in view of the above problems. An object of the present invention is to provide a method of readily removing a thin film from a mask member used for producing a semiconductor device.

According to a first aspect of the present invention, a mask member covers an electronic part with an opening portion, an inner wall of which is covered with a hollow packing member so that a hollow portion of the packing member exposes a specific region of the electronic part. The mask member is further covered with a cover member. In this state, a thin film is formed to coat the specific region through the hollow portion.

Because the mask member is covered with the packing member and the cover member, the thin film is not adhered to the mask member. Accordingly, after detaching the electronic part and the cover member from the mask member, the mask member can be reused to form the thin film on another electronic part successively.

According to a second aspect of the present invention, an electronic part is covered with a mask member, and a thin film is formed to coat a specific region of the electronic part through an opening portion of the mask member. After that, the thin film adhered to the mask member is removed so that the mask member can be reused. In this case, a first surface of the mask member to which the thin film is adhered when the thin film is formed has a surface roughness smaller than a specific surface roughness.

A supplementary film may be formed on the mask member before the thin film is formed so that the supplementary film is interposed between the mask member and the thin film. A bonding strength between the supplementary film and the thin film is smaller than that between the mask member and the thin film. As a result, the thin film can be readily removed from the mask member to be reused.

BRIEF DESCRIPTION OF THE DRAWINGS

Other objects and features of the present invention will become more readily apparent from a better understanding of the preferred embodiments described below with reference to the following drawings, in which;

FIGS. 1A to 1C are cross-sectional views showing a method of producing a semiconductor device in a stepwise manner in a first preferred embodiment of the present invention;

Figure 2:
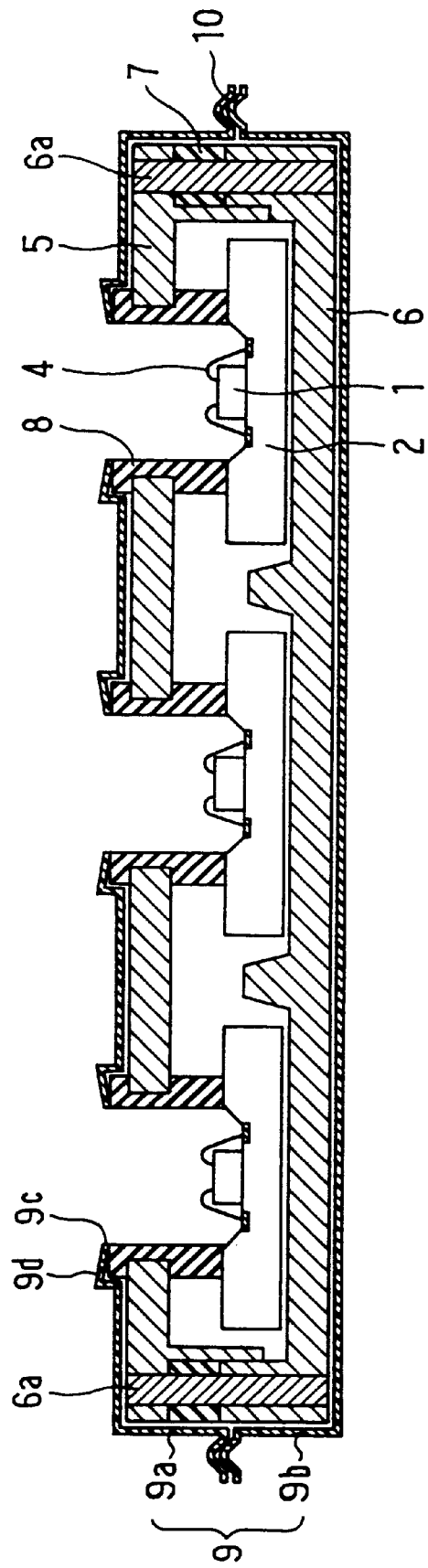
FIG. 2 is a cross-sectional view showing modified frames for holding several electronic parts therein in the first embodiment.

DETAILED DESCRIPTION OF THE PREFERRED EMBODIMENTS (First Embodiment)

A method of producing a semiconductor device in a first preferred embodiment will be explained with reference to FIGS. 1A to 1C.

First, referring to FIG. 1A, an electronic part 2 on which a pressure sensor 1 is mounted is prepared. The electronic part 2 is composed of a mold IC including electronic circuit portions such as a signal processing circuit and an Amp circuit molded with resin. The pressure sensor 1 is electrically connected to the electronic part 2 via electrodes 3 of the circuit portions and wires 4.

Then, a pair of upper and lower frames (mask members) 5, 6 is prepared. Each of the upper and lower frames 5, 6 has a generally U-shape in cross-section, and the upper frame 5 has an opening portion 5a approximately at a central portion of a bottom wall thereof. The opening portion 5a is, for instance, circular. The upper and lower frames 5, 6 can form a cubic shape, and define a space sufficient for holding the electronic part 2 therein by being joined together.

As material for the frames 5, 6, for instance, iron such as S45C, stainless steel such as SUS303, aluminum such as YH75, polyacetal such as juracon, 6-nylon, MC-nylon, and the like are applicable. More preferably, metal having high rigidity is used as the material for the frames 5, 6 for fixedly holding the electronic part 2 as described below. A packing member 7 is disposed at a boundary portion between the upper frame 5 and the lower frame 6 to seal the boundary portion fluid-tightly.

Another packing member 8 is disposed at an inner periphery of the opening portion 5a to cover the inner peripheral wall of the opening portion 5a entirely, and to protrude from an upper surface of the upper frame 5. The packing member 8 has a hollow cylindrical shape with a hollow portion, which is shaped to expose the region where the pressure sensor 1 is mounted. Material for the packing member 8 is selected so that the thin film material can be readily adhered to and absorbed into the packing member 8. Specifically, the packing member 8 is made of rubber such as Si rubber, ethylene-propylene rubber, or fluorine rubber, with a rough surface. The thin film material can therefore be apparently absorbed into irregularities on the rough surface.

In a state where the electronic part 2 is disposed in the space between the upper frame 5 to which the packing member 8 is attached and the lower frame 6, the upper frame 5 and the lower frame 6 are joined together via the packing member 7 by screws or bolts which are not shown. Accordingly, the electronic part 2 is accommodated within the frames 5, 6.

Next, a cover 9 for covering the frames 5, 6 is prepared. The cover 9 is composed of an upper cover 9a and a lower cover 9b, which can be joined together at assembling portions 10 to form an internal space corresponding to the shape of the frames 5, 6 joined together. Material for the cover 9 is selected so that the thin film material is adhered to the cover 9 more readily than the frames 5, 6. That is, the cover 9 is made of material to which the thin film material can be adhered firmly. For instance, PET, polycarbonate, or AS resin is applicable to the material for the cover 9. The cover 9 is thin as compared to the frames 5, 6.

The upper cover 9a has a window portion 9c at a position corresponding to the opening portion 5a of the frame 5, and a stepped portion 9d at the opening edge of the window portion 9c. The stepped portion 9d encircles the opening edge of the window portion 9c and protrudes than the other part. The protruding portion of the packing member 8 protruding from the upper frame 5 is accommodated in the stepped portion 9d. A protruding amount of the protruding portion 9d is decreased as it approaches the opening edge so that the upper cover 9a contacts the protruding portion of the packing member 8 at the entire opening edge.

Accordingly, the thin film material (gas) does not invade to contact the frame 5 at the thin film coating step. Further, because the protruding amount of the protruding portion 9d is decreased toward the opening edge, the surface pressure between the contact surfaces of the upper cover 9a and the packing member 8 can be enhanced.

The upper cover 9a and the lower cover 9b are joined together at the assembling portions 10. Accordingly, only the pressure sensor 1 and a vicinal region around the pressure sensor 1 where the electrodes 3 and the wires 4 are disposed are exposed to undergo the thin film coating step. Other regions such as terminal portions of the electronic part 2, which should be electrically connected to external units, are covered with the frames 5, 6 securely not to be exposed outwardly. Incidentally, in FIGS. 1A to 1C, only one electronic part 2 is accommodated in the frames 5, 6 to undergo the thin film coating step. However, as shown in FIG. 2, several electronic parts 2 may be accommodated in the frames 5, 6 together. In FIG. 2, reference numeral 6a denotes screws or bolts for joining the frames 5, 6 together.

Next, referring to FIG. 1B, the electronic part 2 covered by the upper and lower covers 9a, 9b is placed in a chamber (not shown) such as a deposition apparatus. Then, a resin (for instance, polyparaxylene) thin film 11 is formed on the exposed portion of the electronic part 2 through the hollow portion of the packing member 8 to thereby coat the electrodes 3 and the wires 4. Specifically, the thin film 11 is deposited on the exposed portion of the electronic part 2, the inner wall of the packing member 8, and the outer walls of the upper and lower covers 9a, 9b. The thin film material is not adhered to the other regions of the electronic part 2 covered by the packing member 8 and the covers 9a, 9b.

After performing the thin film coating step, as shown in FIG. 1C, the electronic part 2 is taken out of the frames 5, 6 and the covers 9a, 9b. As a result, the electronic part 2 having the electrodes 3 and the wires 4 coated with the thin film 11 is provided. The frames 5, 6 and the packing member 8 can be reused to form the thin film 11 on another electronic part 2. At that time, the upper and lower covers 9a, 9b are exchanged with new ones.

Thus, because the frames 5, 6 are covered with the upper and lower covers 9a, 9b to prevent deposition of the thin film 11 on the frames 5, 6, the frames 5, 6 can be reused to perform the thin film coating step successively. It is not necessary to perform cleaning of the frames 5, 6 every time. It is sufficient to exchange the covers 9a, 9b every time or after performing the thin film coating step several times.

The thin film material is adhered to the packing member 8; however, the thin film material is apparently absorbed into the packing member 8 so that the size of the hollow portion of the packing member 8 is hardly changed. Therefore, the packing member 8 is also reused several times provided that the hollow portion of the packing member 8 is not changed in size by the thin film 11 not to expose the desirable region of the electronic part 2.

Further, in the present embodiment, the upper and lower covers 9a, 9b and the packing member 8 are made of the materials to which the thin film material is readily adhered. Because of this, the adhered thin film material (thin film 11)

is difficult to be separated from the covers 9a, 9b and the packing member 8, and accordingly, the exposed portion of the electronic part 2 is hardly contaminated by separated thin film parts. Further more, a path defined between the covers 9a, 9b and the frames 5, 6 for allowing the thin film material (gas) to contact the frames 5, 6 can be set long by designing the shapes of the assembling portions 10, the protruding portion 9d, and the like of the covers 9a, 9b appropriately. As a result, the invasion of the gas to the frames 5, 6 can be prevented effectively at the thin film coating step.

Next, the constitution and application of the semiconductor device produced by the method described above will be explained in more detail with reference to FIGS. 3 to 6 below. FIGS. 3 to 6 show a pressure sensor assembly, usable as a vehicle intake pressure sensor, in which a mold IC (electronic part) 2 holding a pressure sensitive element (pressure sensor) 1 is retained in a case 20.

Specifically, the mold IC 2 is formed by molding lead frames 3, which is made of 42 alloy, with epoxy resin including a filler. An opening 2b is formed in a mold resin block 2a of the mold IC 2. The pressure sensitive element 1 for detecting pressure is mounted at inside of the opening 2b.

Figure 4:
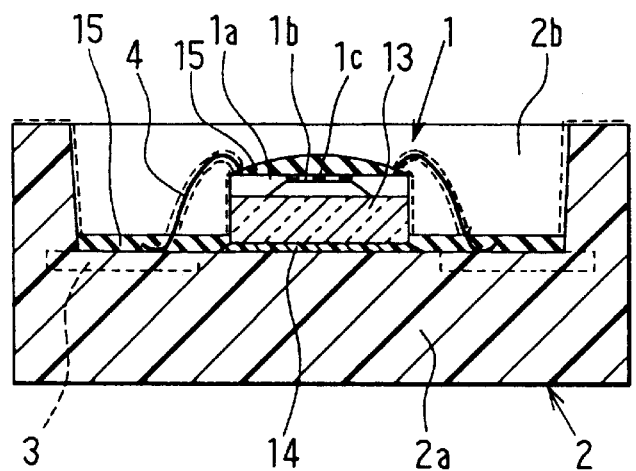
FIG. 4 is a cross-sectional view taken along line IV—IV in FIG. 3.

As shown in FIG. 4, the pressure sensitive element 1 is constituted by a sensor chip 1a comprising a silicon substrate and a glass base 13 anodically bonded to the sensor chip 1a. A diaphragm 1b displaced by receiving pressure is formed at the sensor chip 1a. A diffusion gauge 1c, a resistance value of which is changed in accordance with the displacement of the diaphragm 1b, is formed on the surface of the diaphragm 1b. Further, a reference pressure chamber is formed between the sensor chip 1a and the glass base 13 and the diaphragm 1b is displaced in accordance with a difference between a pressure applied on the surface and a pressure in the reference pressure chamber.

The pressure sensitive element 1 is fixedly adhered onto the mold resin block 2a inside of the opening 2b by a resin adhesive agent 14. Further, an organic gel-like protective member 15 is coated at the surrounding of the sensitive element 1 and on the pressure sensitive element 1. The protective member 15 not only protects the sensor chip 1a against contamination but electrically insulates the lead frames 3 from each other. Further, bonding wires 4 not coated with the gel-like protective member 15, is coated with an organic vapor-deposited film, illustrated by dotted lines in FIG. 3, by which the bonding wires 4 are electrically insulated from each other. This organic vapor-deposited film corresponds to the thin film 11 in the present embodiment, and is formed by the method described above before the gel-like protective member 15 is formed.

The diffusion gauge 1c formed on the surface of the sensor chip 1a is electrically connected to the lead frames 3 by a wiring pattern made of an aluminum thin film (not illustrated) that is formed on the sensor chip 1a and the bonding wires 4. That is, the bonding wires 4 are electrically connected to the lead frames 3 exposed from the molded IC 2 as described above referring to FIG. 1A.

Figure 3:
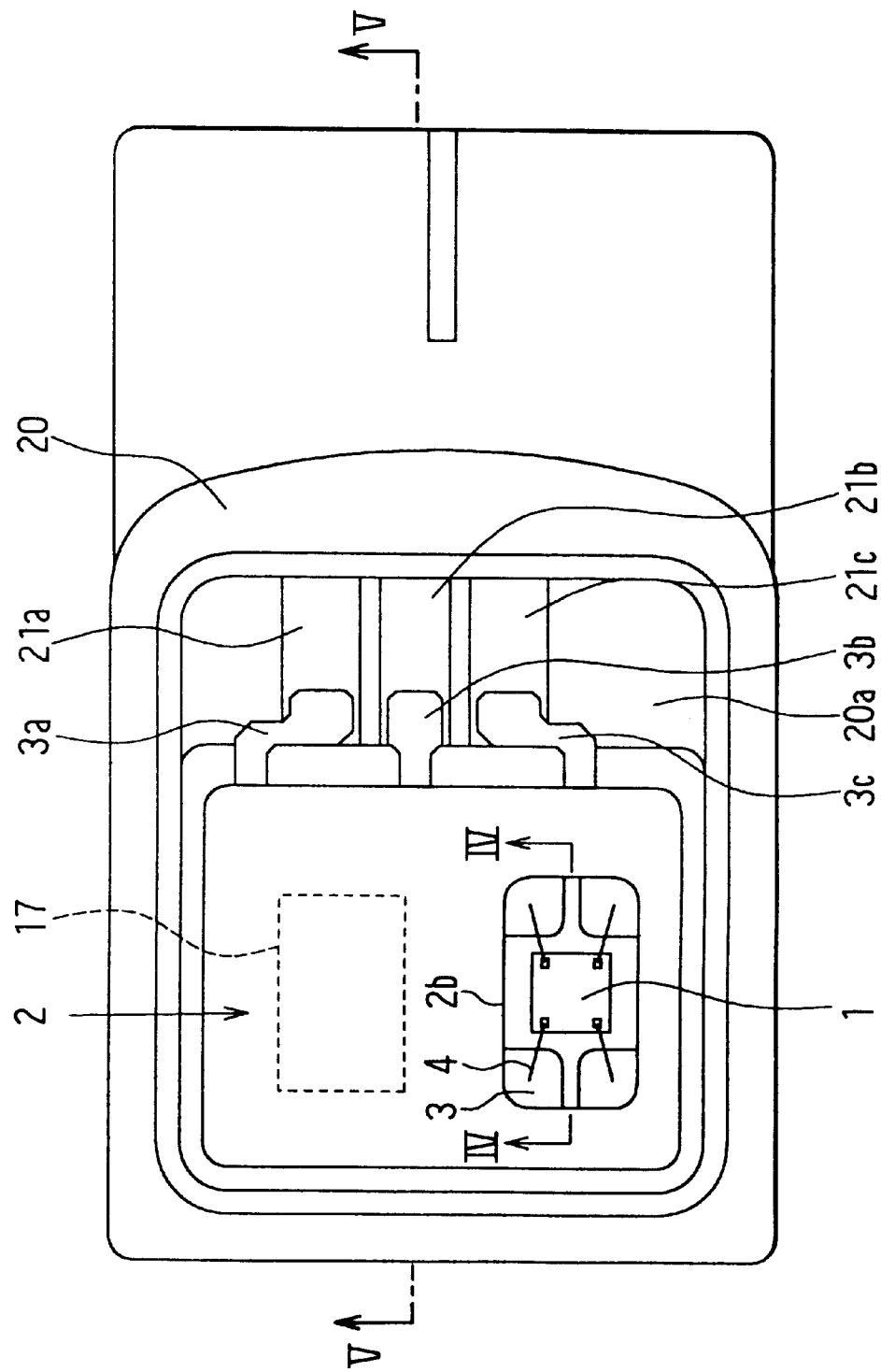
FIG. 3 is a plan view showing a pressure sensor assembly holding the semiconductor device produced by the method shown in FIGS. 1A to 1C.

As illustrated by a dotted line in FIG. 3, an electric signal from the sensor chip 1a is outputted to an IC for signal processing circuit 17 provided on the lead frames 3 at inside of the mold IC 2 and is outputted as a sensor signal after performing a predetermined signal processing. Further, the IC for signal processing circuit 17 is electrically connected to three external terminals 3a, 3b and 3c constituted by the lead frames 3. The external terminal 3a, 3b, and 3c respectively constitute a power source terminal, a ground terminal and a sensor signal output terminal of the IC for signal processing circuit 17.

Figure 5:
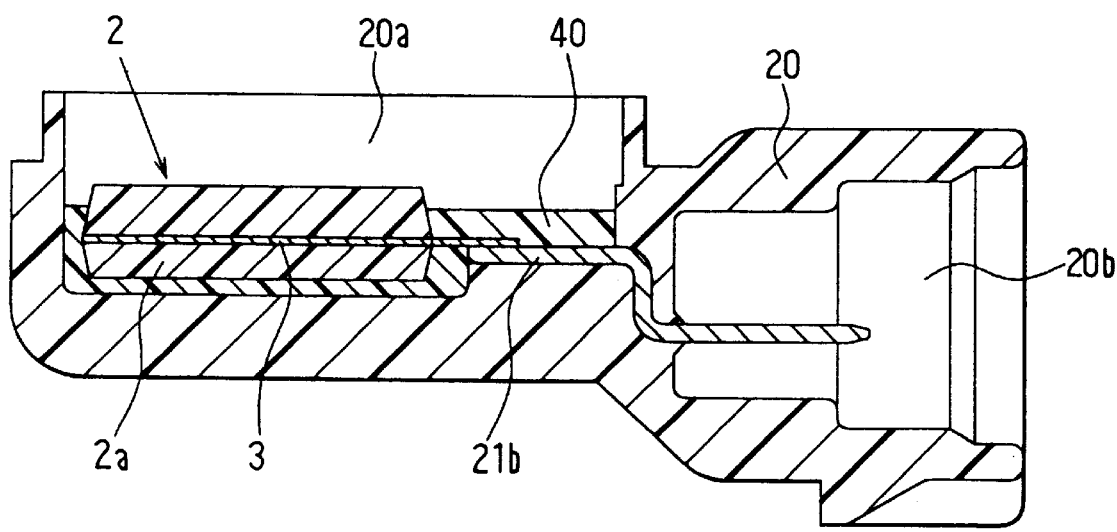
FIG. 5 is a cross-sectional view taken along line V—V in FIG. 3.

The case 20 is constituted by resin, for instance, PBT (polybutylene terephthalate). As shown in FIGS. 3 and 5, the case 20 is provided with an opening 20a for incorporating the mold IC 2 and a connector unit 20b. Three connector pins 21a, 21b and 21c made of copper are insert-molded in the case 20. Ends of the connector pins 21a, 21b and 21c are respectively fixed to the external terminals 3a, 3b, and 3c by welding in an electrically conducted state. Further, respective other ends of the connector pins 21a, 21b and 21c are exposed in the connector unit 20b and electric conduction to outside is executed by the exposed portions.

The mold IC 2 is installed and fixed at inside of the opening 20a of the case 20 by a resin injection molding agent (potting agent) 40. In this case, the external terminals 3a, 3b, and 3c and the connector pins 21a, 21b and 21c are covered by the resin injection molding agent 40. Therefore, water or the like can be prevented from invading from between the external terminals 3a, 3b, and 3c and the mold resin block 2a to inside of the mold IC 2 and further, corrosion of the connector pins 21a, 21b and 21c is prevented such that electric leakage does not occur.

Figure 6:
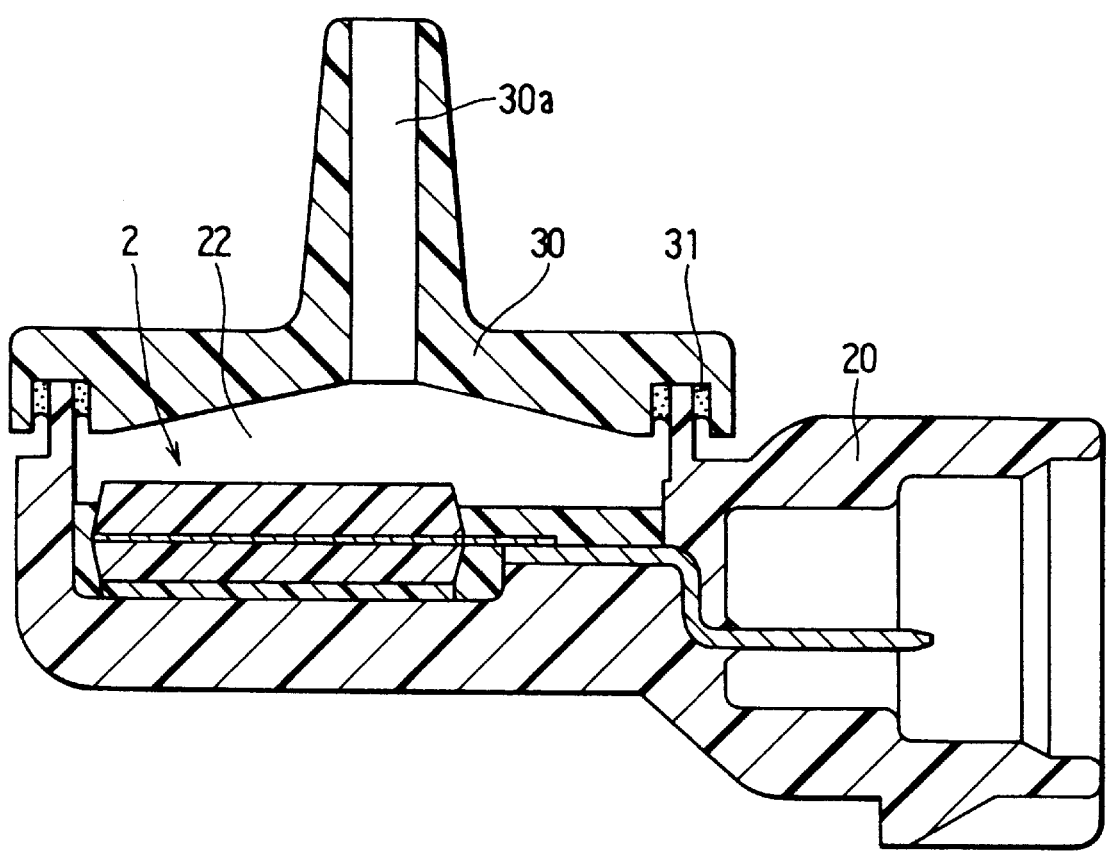
FIG. 6 is a cross-sectional view showing the pressure sensor assembly to which a lid is attached.

Further, after mounting the mold IC 2 to the case 20, as shown in FIG. 6, the case 20 is attached with a lid 30. The lid 30 is provided with a pressure introducing hole 30a for introducing pressure to a pressure receiving chamber 22 in the case 20. Further, the lid 30 is fixedly adhered to the case 20 by an adhesive agent 31 by which the pressure receiving chamber 22 is sealed from outside. Further, the pressure introducing hole 30a is connected to a surge tank via a rubber hose, not illustrated.

According to the above-described constitution, pressure of a medium to be measured (air) that is introduced to the pressure receiving chamber 22 via the pressure introducing hole 30a of the lid 30, is detected by the pressure sensitive element 1. The electric signal from the pressure sensitive element 1 is inputted to the IC for signal processing circuit 17 via the bonding wires 4 and the lead frames 3. Further, the signal is amplified at the IC for signal processing circuit 17 and is outputted to outside as a sensor signal from the external terminals and the terminals.

In the constitution described above, the external terminals 3a, 3b, and 3c of the lead frames 3 are exposed from the mold IC 2 when the thin film 11 (the organic vapor-deposited film) is formed. However, because the mold IC 2 is covered with the frames 5, 6 when the thin film 11 is formed, the thin film 11 is not formed on the external terminals 3a, 3b, and 3c. Therefore, the external terminals 3a, 3b, and 3c can provide sufficient electrical communication with the connector pins 21a, 21b and 21c.

(Second Embodiment)

A method for producing a semiconductor device in a second preferred embodiment will be explained with reference to FIGS. 7A to 7C, focusing on differences from the first embodiment.

Figure 7A:
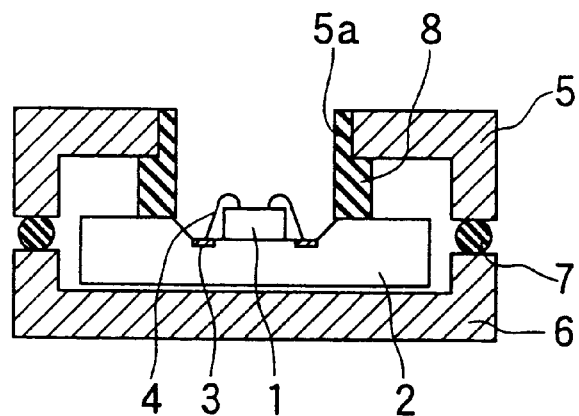
FIGS. 7A to 7C are cross-sectional views showing a method of producing a semiconductor device in a stepwise manner in a second preferred embodiment of the present invention.
Figure 7B:
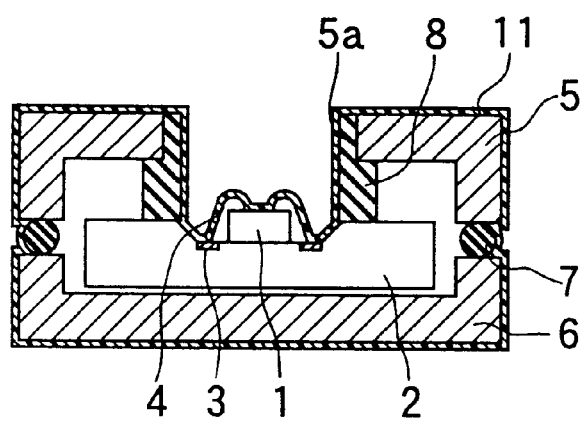

First, as shown in FIG. 7A, the frames 5, 6, the packing members 7, 8, shapes of which are substantially the same as those in the first embodiment, are prepared. The second embodiment dispenses with the covers 9a, 9b. The surfaces of the frames 5, 6 undergo a flattening process to be partially flattened with a surface roughness approximately less than 0.6 Rz. The flattening process is performed to at least the regions of the frames 5, 6 to which the thin film 11 is adhered at a step described below.

Figure 8:
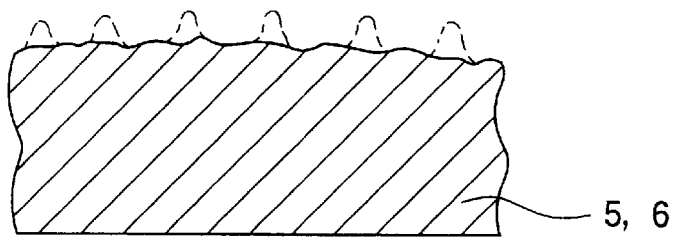
FIG. 8 is a schematic diagram for explaining a surface state of a frame.

Specifically, similarly to the first embodiment, after the packing member 8 is disposed in the opening portion 5a of the upper frame 5, the upper frame 5 and the lower frame 6 are joined together with the electronic part 2 accommodated therein. In this state, the flattened surfaces of the frames 5, 6 are surfaces externally exposed and excluding the inner surfaces forming the inner space and the peripheral surface of the opening portion 5a. A flattened surface state of the frames 5, 6 is schematically shown in FIG. 8, in which a surface state before flattened is indicated by a dotted line as a reference.

Next, the electronic part 2 is placed within a chamber such as a deposition apparatus together with the frames 5, 6. Then, as shown in FIG. 7B, the resin (for instance, polyparaxylene) thin film 11 is formed on the exposed portion of the electronic part 2 through the hollow portion of the packing member 8. The thin film 11 is deposited on the inner wall of packing member 8 and the frames 5, 6 as well. That is, the thin film 11 is deposited only on the desired portion of the electronic part 2 and only on the flattened surfaces of the frames 5, 6.

Figure 7C:
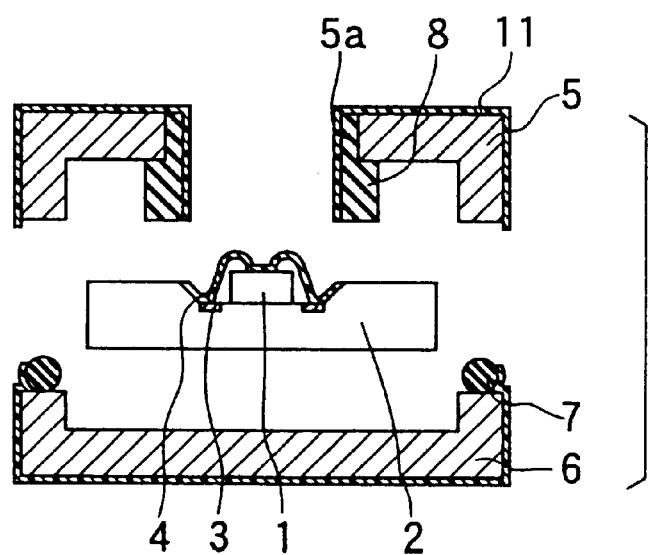

After that, as shown in FIG. 7C, the electronic part 2 is taken out of the frames 5, 6. Accordingly, the electronic part 2 having the electrodes 3 and the wires 4 coated with the thin film 11 is provided. The thin film 11 adhered to the frames 5, 6 can be readily removed, because the thin film 11 is deposited only on the flattened surface of the frames 5, 6.

Figure 9A:
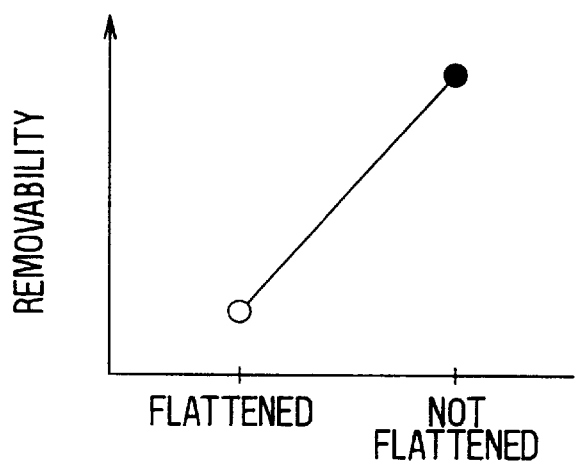
FIG. 9A is a graph showing removability of a thin film from the frame in cases in which a flattening process is performed and is not performed.

FIG. 9A shows removability of the thin film comparing two cases in that the flattening process is performed and is not performed, i.e., the surface for holding the thin film is flattened or not flattened. The result shown in FIG. 9A was obtained when polyparaxylene was used as the thin film material, and YH75 (aluminum) was used as the material for the frames 5, 6. The removability was evaluated by a lattice pattern cutting test. Specifically, cut lines were formed on a square thin film 11 having a side of 1 cm to have a lattice pattern with an interval of 1 mm. Then, a specific adhesive tape was attached to and detached from the square thin film 11. The removability was determined in accordance with an amount of thin film chips removed from the square thin film 11 by the adhesive tape. As understood from the figure, the flattening process performed to the frames 5, 6 facilitates the removal of the thin film 11 deposited thereon as compared to the case in that the flattening process is not performed.

Figure 9B:
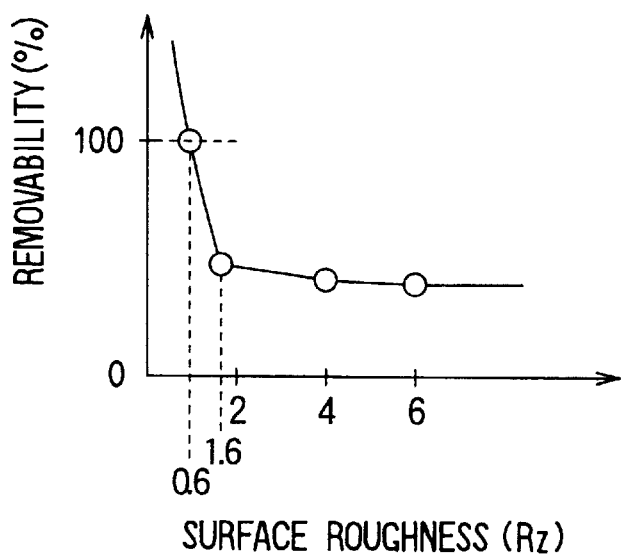
FIG. 9B is a graph showing a relation between the surface roughness of the frame and the removability of the thin film from the frame.

FIG. 9B shows a relation between the removability and surface roughness of the frames 5, 6. As shown in the figure, the removability was suddenly increased when the surface roughness was less than 10. Rz. When the surface roughness was decreased to 0.6 Rz, the removability was 100%. This means that all the square thin film 11 cut into a lattice pattern was removed by the adhesive tape. Thus, the thin film 11 can be readily removed from the frames 5, 6 by performing the flattening process to the frames 5, 6.

(Third Embodiment)

In the second embodiment, the surfaces of the frames 5, 6 are flattened by polishing. In a third preferred embodiment, a supplementary film 12 is formed on the frames 5, 6 to flatten the surfaces of the frames 5, 6. The other features than the flattening method for the frames 5, 6 are the same as those in the second embodiment. Therefore, only the method for coating the surfaces of the frames 5, 6 with the supplementary film 12 will be explained below.

Figure 10:
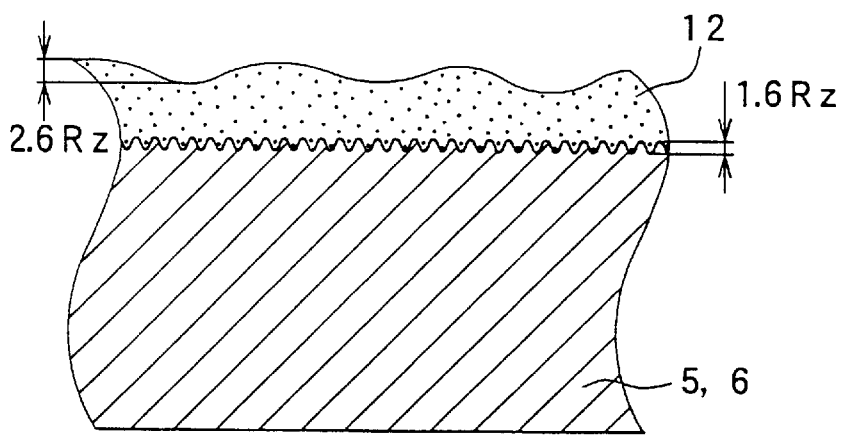
FIG. 10 is a schematic diagram for explaining a surface state of a frame in a third preferred embodiment of the present invention.
Figure 11:
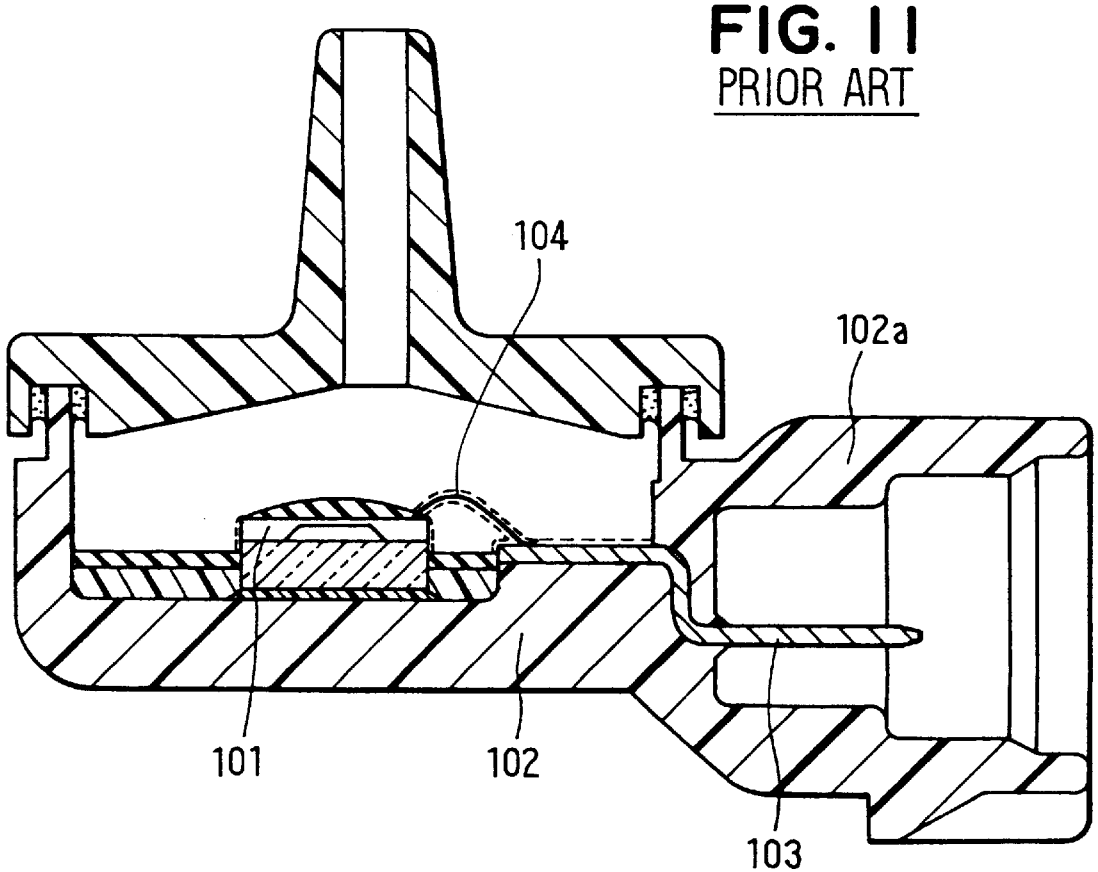
FIG. 11 is a cross-sectional view showing a semiconductor device produced by coating a wire by a conventional method.

FIG. 10 is an enlarged view showing a surface portion of the frames 5, 6 covered with the supplementary film 12 as an example. As shown in the figure, the rough surface of the frames 5, 6 is covered with the supplementary film 12 formed from fluorine resin or electroless Ni plating. Accordingly, the surface roughness of the frames 5, 6 is reduced, for instance, approximately less than 0.6 Rz. However, it is not always necessary that the surface roughness of the supplementary film 12 is smaller than that of the frames 5, 6, provided that the bonding strength between the supplementary film 12 and the thin film 11 is larger than that between the frames 5, 6 and the thin film 11.

Thus, the bonding strength of the thin film 11 to the frames 5, 6 is lessened by forming the supplementary film 12 on the frames 5, 6 before the thin film 11 is formed. As a result, even when the thin film 11 is deposited on the frames 5, 6 at the thin film coating step for corrosion prevention, the thin film 11 can be readily removed from the frames 5, 6. As material combinations between the frames 5, 6 and the supplementary film 12, when the frames 5, 6 are made of S45C (iron), the supplementary film 12 is preferably made of either of fluorine resin and electroless Ni plating. When the frames 5, 6 are made of SUS303 or YH75 (aluminum), the supplementary film 12 is preferably formed from fluorine resin by coating. If necessary, Cr plating, metal spraying, or alumite treatment may be carried out as a pretreatment for coating fluorine resin.

In the second embodiment, the relation between the removability of the thin film 11 and the surface roughness of the frames 5, 6 (FIGS. 9A and 9B) are evaluated when the thin film 11 is made of polyparaxylene and the frames 5, 6 are made of YH75 (aluminum). However, this relation varies in accordance with the materials. Therefore, the desirable surface roughness of the frames 5, 6 should be determined in accordance with the materials selected for the thin film 11 and the frames 5, 6.

In the first embodiment, the material for the frames 5, 6 is selected so that the thin film 11 is not easily adhered to the frames 5, 6; however, the present invention can be applied even when such a material is not selected. In the second and third embodiments, only the surfaces of the frames 5, 6 to which the thin film 11 is adhered undergo the flattening process; however, the other surfaces of the frames 5, 6 to which the thin film 11 is not adhered may undergo the flattening process.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for producing a semiconductor device, comprising:
   preparing an electronic part having a specific region which is to be coated with a thin film;
   preparing a mask member which has an opening portion;
   disposing a hollow packing member in the opening portion of the mask member to cover an inner wall of the opening portion;
   covering the electronic part with the mask member having the packing member so that the specific region of the electronic part is exposed from a hollow portion of the packing member;
   covering the mask member with a cover member which has a window portion at a position corresponding to the hollow portion;
   forming a thin film to coat the specific region through the hollow portion; and
   detaching the electronic part from the mask member.

2. The method of claim 1, wherein covering the electronic part includes disposing the electronic part in a space defined in the mask member.

3. The method of claim 2, wherein:
   the packing member disposed in the opening portion of the mask member has a protruding portion protruding from the mask member; and the cover member has a stepped portion for accommodating the protruding portion therein in contact with the protruding portion at the entire opening edge of the window portion.

4. The method of claim 3, wherein a protruding amount of the stepped portion is decreased as a distance from the opening edge is decreased.

5. The method of claim 1, wherein the cover member contacts the packing member at an entire opening edge of the window portion.

6. The method of claim 1, wherein a thin film material for forming the thin film is adhered to a material for forming the cover member more readily than a material for forming the mask member.

7. The method of claim 6, wherein the cover member is made of one selected from polycarbonate and AS resin.

8. The method of claim 1, wherein the packing member has irregularities on a surface thereof for apparently absorbing a thin film material for forming the thin film.

9. The method of claim 1, wherein the mask member is made of one selected from a group consisting of S45C, SUS303, YH75, polyacetal, 6-nylon, and MC-nylon.

10. The method of claim 1, wherein:
a semiconductor chip is mounted on the electronic part and is electrically connected to an electrode of the electronic part via a wire; and
the semiconductor chip, the wire, and the electrode are exposed from the hollow portion of the packing member through which the thin film is formed.

11. A method for producing a semiconductor device, comprising:
preparing an electronic part having a specific region which is to be coated with a thin film;
preparing a mask member having an opening portion;
covering the electronic part with the mask member so that the specific region of the electronic part is exposed from the opening portion;
forming a thin film to coat the specific region through the opening portion;
detaching the mask member from the electronic part; and
removing the thin film adhered to the mask member to reuse the mask member,
wherein a first surface of the mask member to which the thin film is adhered when the thin film is formed has a surface roughness smaller than a specific surface roughness.

12. The method of claim 11, wherein the surface roughness of the first surface is smaller than a surface roughness of a second surface of the mask member to which the thin film is not adhered when the thin film is formed.

13. The method of claim 11, further comprising disposing a hollow packing member in the opening portion of the mask member to cover an inner wall of the opening portion, before the electronic part is covered with the mask member, wherein;
the specific region of the electronic part is exposed from a hollow portion of the packing member through which the thin film is formed; and
the surface roughness of the first surface is smaller than a surface roughness of the inner wall of the opening portion which is covered with the packing member when the thin film is formed.

14. The method of claim 11, wherein the surface roughness of the first surface is less than approximately 1.6 Rz.

15. The method of claim 14, wherein the surface roughness of the first surface is less than approximately 0.6 Rz.

16. The method of claim 11, wherein the mask member is made of one selected from a group consisting of S45C, SUS303, YH75, polyacetal, 6-nylon, and MC-nylon.

17. The method of claim 11, wherein:
a semiconductor chip is mounted on the electronic part and is electrically connected to an electrode of the electronic part via a wire; and
the semiconductor chip, the wire, and the electrode are exposed from the opening portion of the mask member through which the thin film is formed.

18. A method for producing a semiconductor device, comprising:
preparing an electronic part having a specific region which is to be coated with a thin film;
preparing a mask member having an opening portion;
covering the electronic part with the mask member so that the specific region of the electronic part is exposed from the opening portion;
forming a thin film to coat the specific region through the opening portion;
detaching the mask member from the electronic part; and
removing the thin film adhered to the mask member to reuse the mask member,
wherein a supplementary film is formed on the mask member before forming the thin film so that the supplementary film is interposed between the mask member and the thin film; and
wherein a bonding strength between the supplementary film and the thin film is smaller than a bonding strength between the mask member and the thin film.

19. The method of claim 18, further comprising disposing a hollow packing member in the opening portion of the mask member to cover an inner wall of the opening portion, before the electronic part is covered with the mask member,
wherein the thin film is formed on the specific region through a hollow portion of the packing member.

20. The method of claim 18, wherein the supplementary film is made of one of electroless Ni plating and fluorine resin.

21. The method of claim 18, wherein the mask member is made of one selected from a group consisting of S45C, SUS303, YH75, polyacetal, 6-nylon, and MC-nylon.

22. The method of claim 18, wherein:
a semiconductor chip is mounted on the electronic part and is electrically connected to an electrode of the electronic part via a wire; and
the semiconductor chip, the wire, and the electrode are exposed from the opening portion of the mask member through which the thin film is formed.

* * * * *

UNITED STATES PATENT AND TRADEMARK OFFICE
CERTIFICATE OF CORRECTION

PATENT NO.   : 6,300,155 B1
DATED        : October 9, 2001
INVENTOR(S)  : Takafumi Taki and Ryoichi Handa It is certified that error appears in the above-identified patent and that said Letters Patent is hereby corrected as shown below:

<u>Title page, Item [54] and Column 1,</u>
Lines 1-2, complete the title of the invention "METHOD FOR PRODUCING SEMICONDUCTOR DEVICE BY COATING" as -- METHOD FOR PRODUCING SEMICONDUCTOR DEVICE BY COATING WIRES AND ELECTRODE WITH THIN FILM --

Signed and Sealed this

Eleventh Day of June, 2002

*Attest:*

*Attesting Officer*

JAMES E. ROGAN
*Director of the United States Patent and Trademark Office*